United States Patent [19]

Atkinson et al.

[11] 4,185,240

[45] Jan. 22, 1980

[54] CHANNEL SELECTOR SYSTEM

[75] Inventors: Lowell G. Atkinson, Indianapolis; Edmund E. Kennedy, Shelbyville, both of Ind.

[73] Assignee: General Aviation Electronics, Inc., Indianapolis, Ind.

[21] Appl. No.: 797,458

[22] Filed: May 16, 1977

[51] Int. Cl.² .................... H04B 1/04; H04B 1/54
[52] U.S. Cl. .................................. 325/25; 325/21; 325/171; 343/176
[58] Field of Search ................. 325/21, 22, 156, 158, 325/171, 452, 458, 459, 468, 464, 15, 16, 55, 64; 200/11 DA, 11 TW, 11 G; 343/175, 176; 179/2 EA, 2 EB

[56] References Cited

U.S. PATENT DOCUMENTS

| | | | |
|---|---|---|---|
| 3,065,421 | 11/1962 | Hart | 325/16 |
| 3,201,714 | 8/1965 | Border et al. | 325/2 |
| 4,048,561 | 9/1977 | Wilcox et al. | 325/22 |
| 4,082,919 | 4/1978 | Day et al. | 325/64 |
| 4,101,835 | 7/1978 | Taylor et al. | 325/64 |

OTHER PUBLICATIONS

Rotary Switch Squeezes in to Minimal Envelope, R. F. Stengel, Design News, 2/7/77, pp. 52–53.
CB Transceiver Roundup, Radio–Electronics, Aug. 1976, Robert F. Scott, p. 38, Automatic CXB-2472.
SBE Touch/Com., Jun. 1976, Popular Electronics.

Primary Examiner—Robert L. Griffin
Assistant Examiner—Tommy P. Chin
Attorney, Agent, or Firm—Gust, Irish, Jeffers & Rickert

[57] ABSTRACT

A transceiver channel selection circuit operable in both transmit and receive modes of operation including a digital phase lock circuit having a controllable oscillator, a reference frequency source, and means for obtaining a signal, the frequency of which is an aliquot part of the controllable oscillator frequency, are connected together in a feedback loop and the reference frequency and submultiple frequency compared and the controllable oscillator frequency changed, if the submultiple and reference frequencies differ. The particular submultiple or aliquot portion of the controllable oscillator frequency is determined by a manually operable selector switch, the state of which programs counters to count up to value determined by the particular switch state and the particular submultiple is different in the receive and transmit modes on a particular selected channel with this difference being a first fixed value for simplex channels and a second fixed value for duplex channels, with the simplex or duplex mode of operation being at least in part determined by the particular channel selected. The channel selector switch includes receive only channel positions and provides a transmitter lockout signal for those channels and certain switch contacts may provide for direct energization of an illuminated channel indicated display arrangement.

15 Claims, 6 Drawing Figures

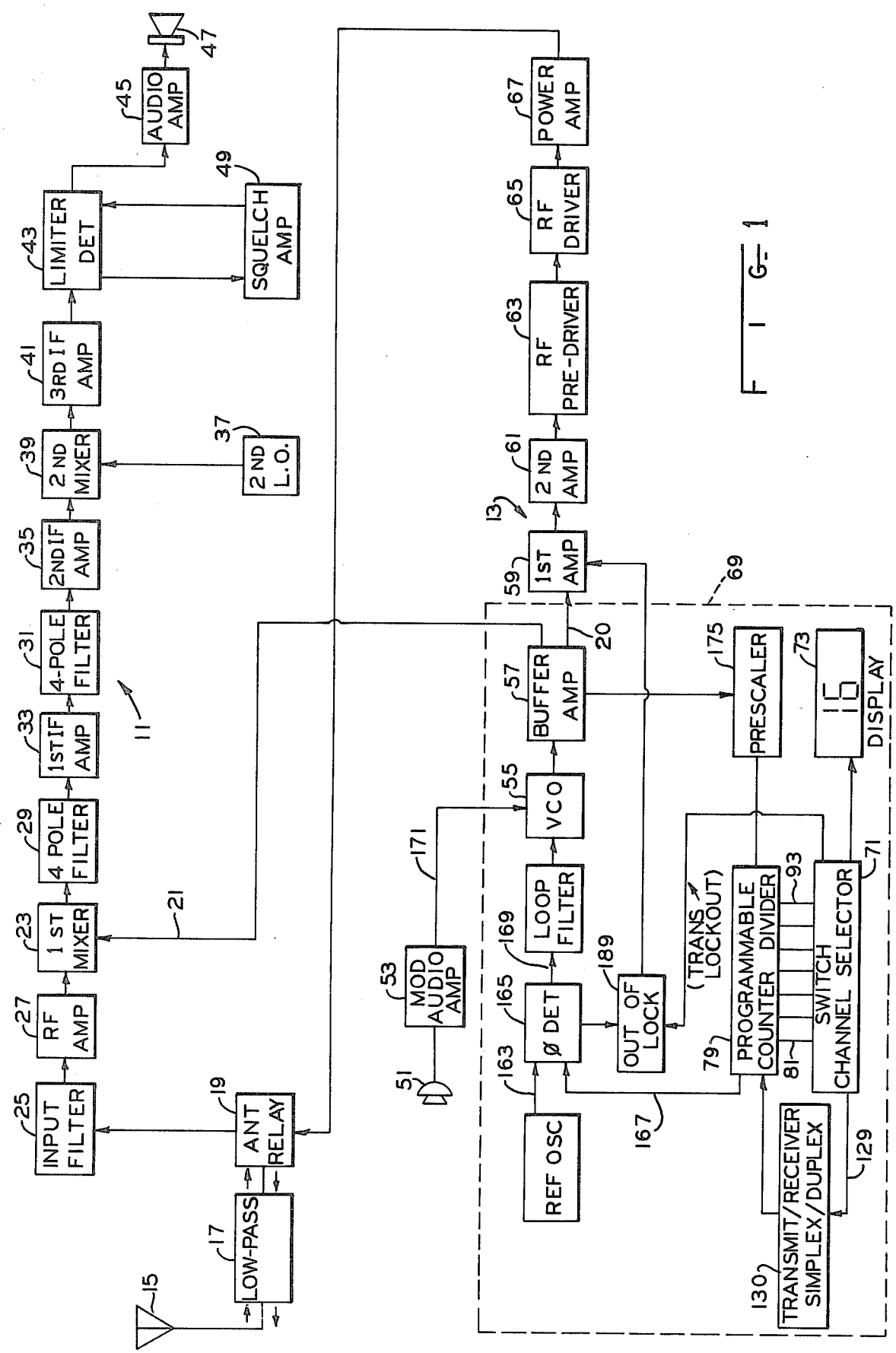

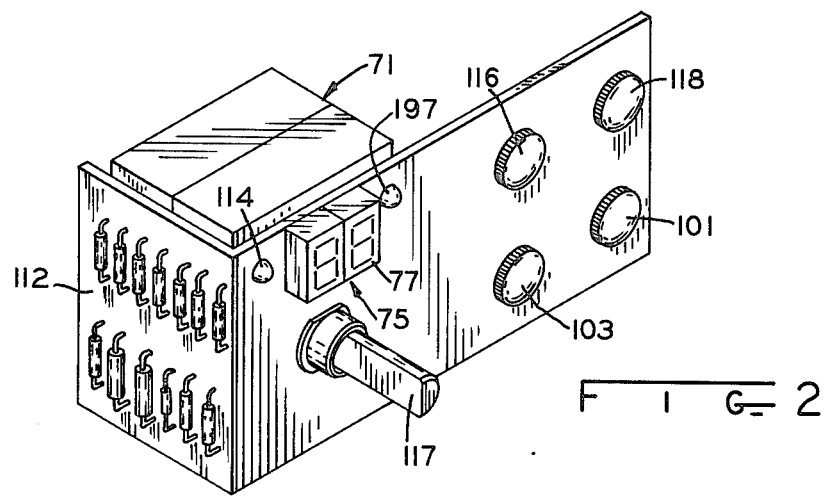
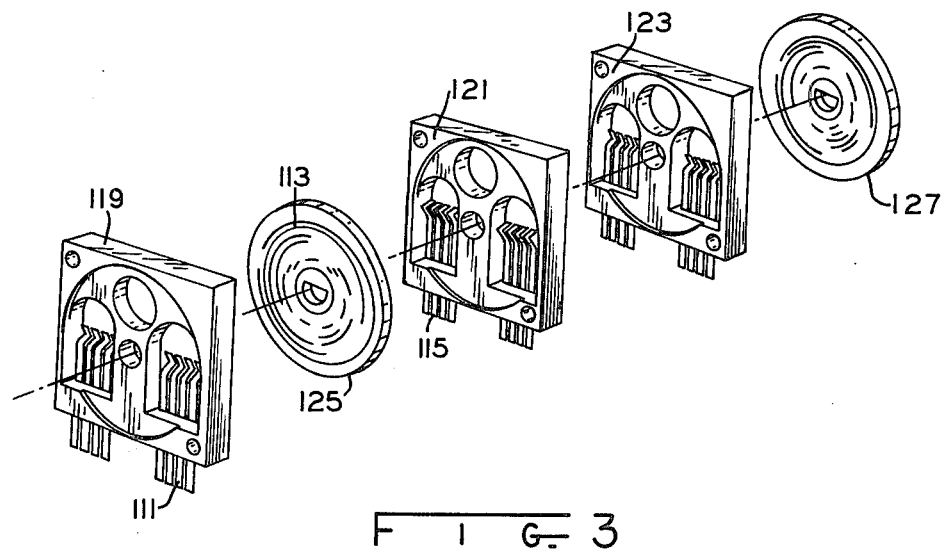

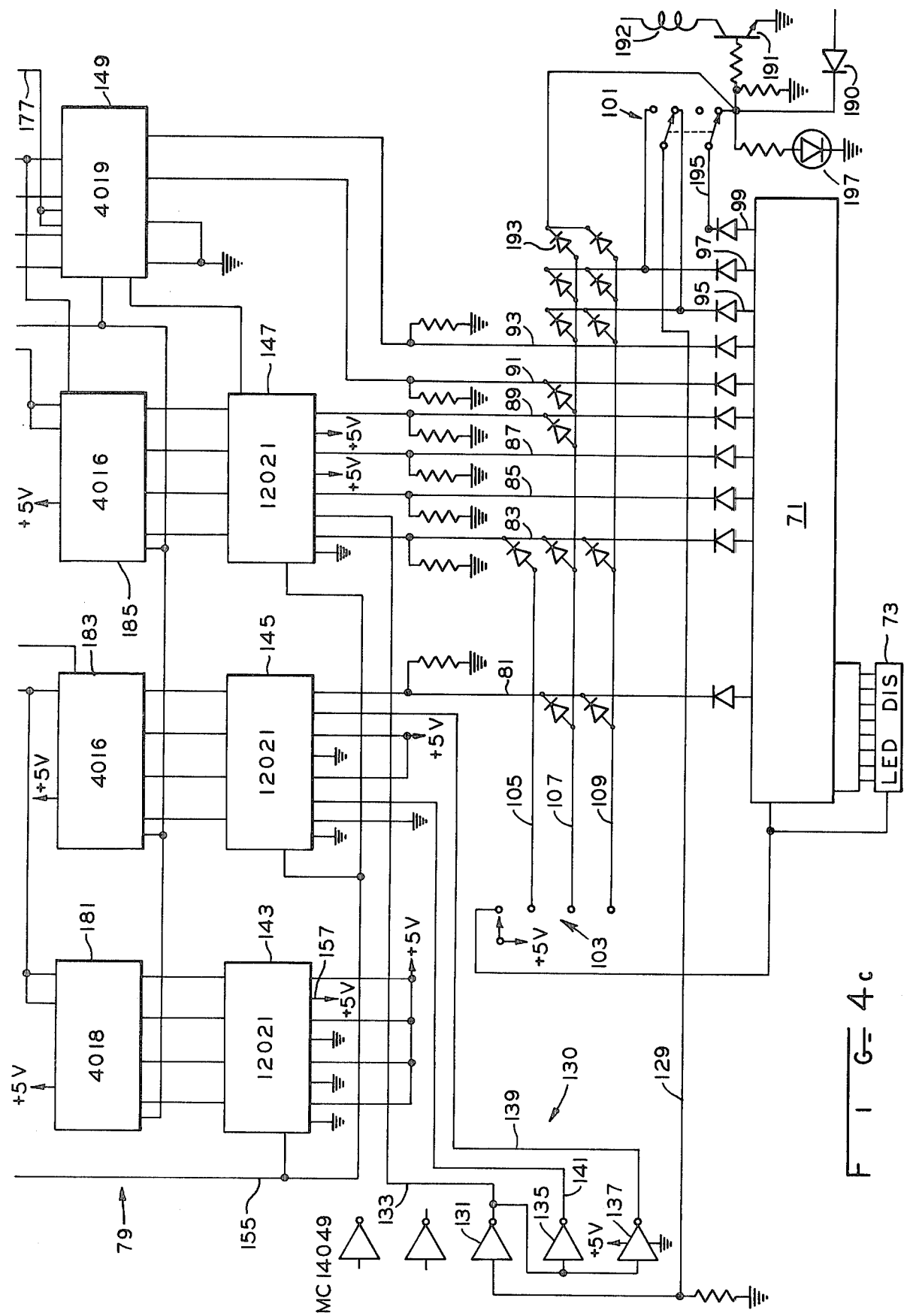

CHANNEL SELECTOR SYSTEM

BACKGROUND OF THE INVENTION

This invention relates generally to frequency selecting arrangements and more particularly to a multiposition manually operable channel selector switching arrangement for a transceiver which provides the desired transmitter output frequency in the transmit mode of operation and the appropriate local oscillator injection frequency in the receive mode of operation.

Arrangements for selecting operating frequencies for radio frequency transmitters and receivers are well known and vary in sophistication from a variable reactance in a tuned circuit to so-called frequency synthesizers. Such synthesizers may derive frequency steps typically decadic from a crystal stabilized frequency standard by harmonic generation and frequency division and may also include a variable frequency source to fill in between the frequency steps thereby providing a wide range of frequencies using relatively few crystals or other basic frequency sources. Another type of frequency synthesizer employs a reference frequency source and a controllable oscillator with the controllable oscillator output and the reference frequency source being compared by a feedback arrangement and the results of that comparison used to modify the controllable oscillator to provide the desired output frequency. Multiples or aliquot portions of the controllable oscillator output may be compared to the reference frequency as needed to provide the desired output frequency range. In a multichannel transceiver, frequency generation of this phase lock variety is known, however, when a large number of channels are to be provided along with several selectable operating modes, the switching problems become increasingly complex from the manufacturer's and/or user's point of view.

SUMMARY OF THE INVENTION

Among the several objects of this invention may be noted the provision of a switching arrangement for a transceiver to select a desired operating channel with a minimum of operator inconvenience; the provision of a single rotary switch for selecting a desired operating channel and to establish both the transmitting and receiving frequencies for that selected channel; the provision of a frequency selecting switching arrangement in accordance with the previous object having a further manually operable switch for determining a particular mode of operation for the selected channel; the provision of a simplistic channel display arrangement controlled by the channel selecting switch yet independent of the mode determining switch of the previous object; and the provision of a transceiver frequency selecting arrangement characterized by its economy of manufacture and simplicity of operation.

In general and in one form of the invention, a multiposition manually operable channel selector switch for a transceiver to select a receive frequency in the receive mode of operation and a transmit frequency in the transmit mode of operation includes means operable in certain channel selecting switch positions for precluding transmitter operation on those certain selected channels. Also in general and in one form of the invention, the multiposition channel selector switch defines a receive frequency and a transmit frequency which in certain channel selecting switch positions provides the same frequency for transmission and reception while in another channel selecting switch position different frequencies are employed for transmission and reception. The particular channels which are simplex or the same transmit and receive frequencies and the particular channels which are duplex or different transmission and reception frequencies may be redefined by other switching arrangements to thereby further extend the versatility of the channel selector switch.

BRIEF DESCRIPTION OF THE DRAWING

FIG. 1 is a schematic block diagram of a transceiver embodying the present invention;

FIG. 2 is a perspective view of a rotary switch and display arrangement suitable for use in the transceiver of FIG. 1;

FIG. 3 is a partial exploded perspective view illustrating the stationary contacts and rotatable disc employed within the switch of FIG. 2; and FIGS. 4a through 4c when joined together form a detailed schematic diagram illustrating primarily the selector switch and locked loop portion of the transceiver of FIG. 1.

Corresponding reference characters indicate corresponding parts throughout the several views of the drawing.

Figure 4A:
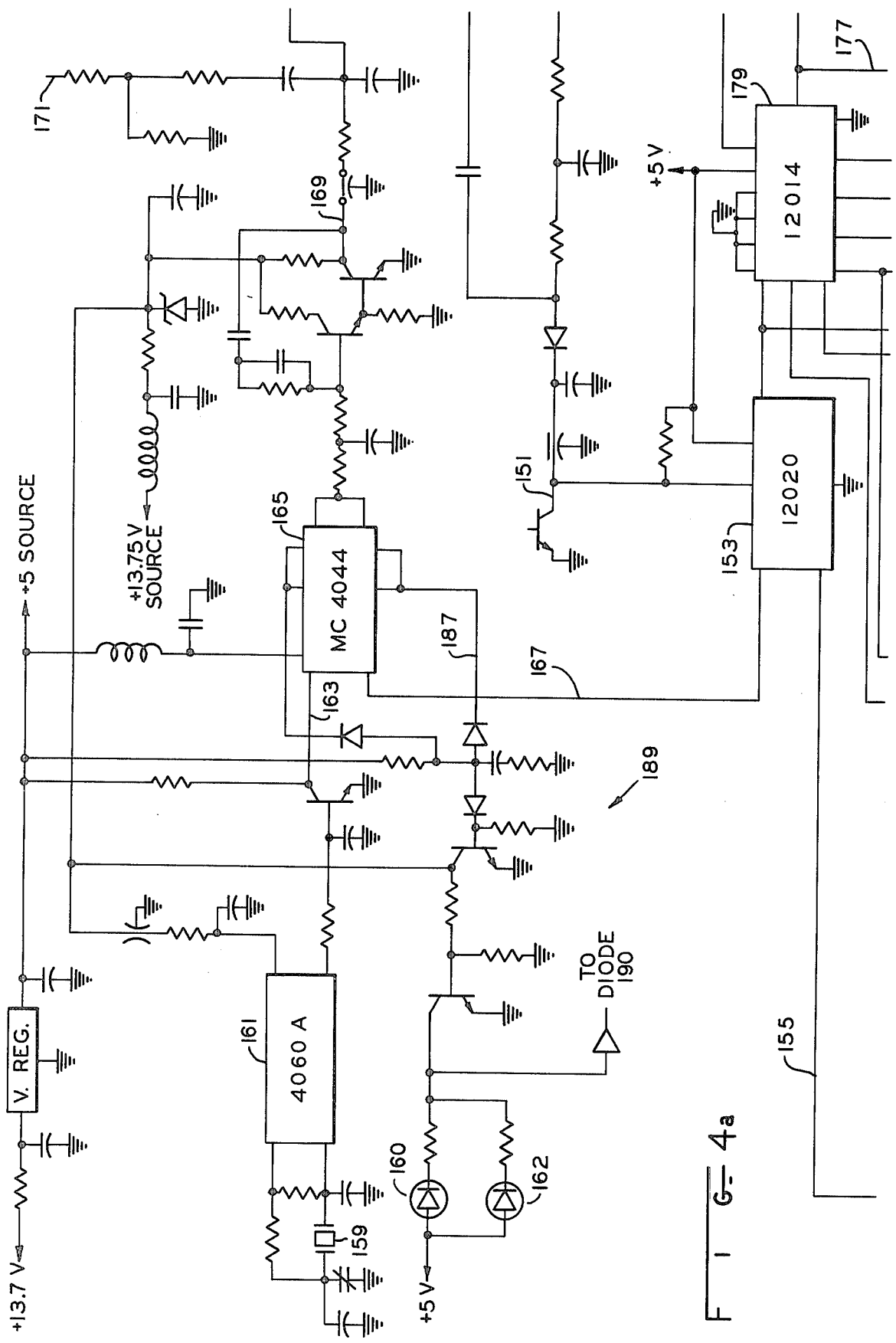

The exemplification set out herein illustrates an embodiment of the invention in one form thereof and such exemplification is not to be construed as limiting in any manner the scope of the invention.

DESCRIPTION OF THE PREFERRED EMBODIMENT

Referring now to the drawing and more particularly to the transceiver block diagram of FIG. 1, the transceiver includes generally a receiver portion 11 and a transmitter portion 13, sharing a common antenna 15, and low pass filter 17, through contacts of the antenna switching relay 19. The receiver 11 is a conventional fm super hetrodyne receiver independent of the transmitter except for the input line 21 which provides the receive frequency determining local oscillator signal to a first mixer stage 23 which local oscillator frequency is determined by the channel selecting arrangements common to the receiver 11 and transmitter 13. The receiver 11 thus comprises an input filter 25, radio frequency amplifier 27, a first mixer stage 23 receiving a local oscillator signal on line 21, a pair of four pole filters 29 and 31 coupled together by a first intermediate frequency amplifier stage 33, and supplying an output signal to a second intermediate frequency amplifier stage 35. A second local oscillator source 37 supplies a fixed frequency signal to a second mixer 39, the output of which is supplied by way of a third intermediate frequency amplifier stage 41 to a limiter detector circuit 43, and by way of audio amplifier 45 to the output transducer or speaker 47. A squelch amplifier 49 may be used in conjunction with the limiter detector 43 if desired.

The transmitter portion 13 of the transceiver depicted in FIG. 1 receives an audio input from the microphone 51 which by way of an audio amplifier 53 modulates a voltage controlled oscillator 55 to supply a frequency modulated radio frequency signal by way of buffer amplifier 57 and first and second amplifier stages 59 and 61 to radio frequency predriver and driver stages 63 and 65. A final power amplifier stage 67 supplies the frequency modulated signals to the antenna 15 by way of the antenna relay 19 and low pass filter 17.

Figure 4B:
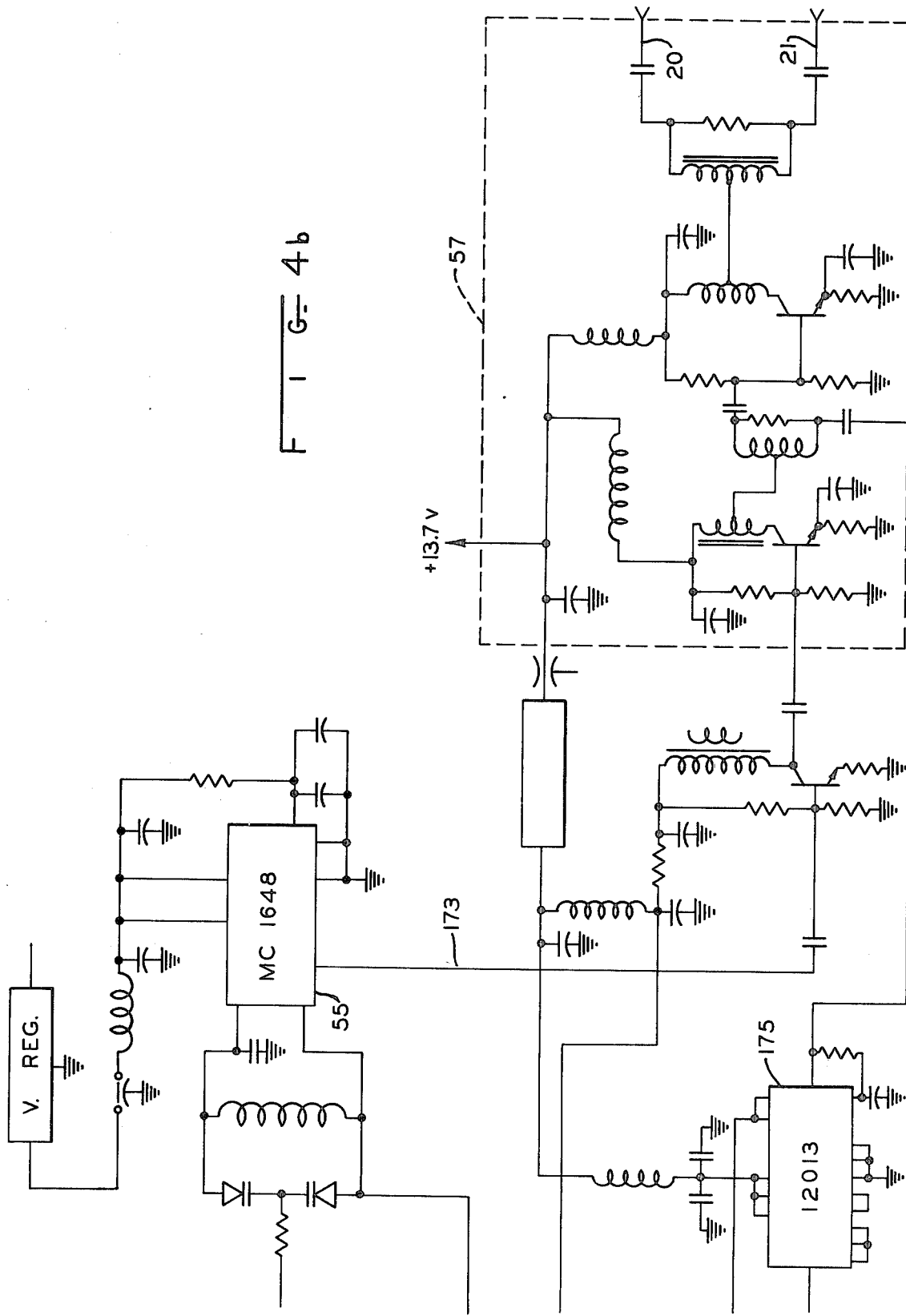

The portion of FIG. 1 enclosed within dotted lines 69 is illustrated in detail in FIGS. 4a through 4c, and those Figures should be considered together for a more clear and complete understanding of the channel selection process. An operator actuable rotary channel selector switch 71 energizes directly through certain of its contacts, a two decimal digit display 73, which may for example comprise a pair of seven segment display devices 75 and 77. A binary code indicative of the selected channel is also provided from the channel selector switch to a programmable counter divider arrangement 79 by way of lines 81, 83, 85, 87, 89, 91 and 93. Channel selector switch 71 also provides an indication of either simplex or duplex operation on lines 95 and 97 and additionally provides a transmitter lock-out indication for certain receive only channels on line 99.

The binary information supplied to the programmable counter 79 determines the frequency or frequencies of operation for the transceiver. This binary information depends upon the particular setting or channel selection of switch 71 and additionally may be modified or supplanted by two other operator actuable switches. A double pole single throw switch 101 designates certain selectable channels for duplex operation in one position and while designating another, not necessarily distinct set of channels, for duplex operation in the other position. Such a feature has particular utility, for example, in a marine radio where both United States and international channel designations are encountered. While the transmitted frequencies are the same for both United States and international channel designations, the receive frequency on some of those channels differ due to duplex capability being designated on different channels in some cases.

A four position rotary switch 103 is also operator actuable and functions to quickly select often used channels by overriding the channel selected on selector switch 71 even though the often used channel may also be dialable on selector switch 71. Thus for example, marine channel 16 is designated as an emergency channel and may be selected by switch 103, coupling the five volt (logical 1 or high state) to line 105. Similarly enabling lines 107 or 109 will select commonly monitored weather channels. The last position for switch 103 is the dial position where the exemplary five volt high signal is supplied to the channel selector switch 71 enabling that switch for selection purposes.

Switch 71 may be of the type depicted in FIGS. 2 and 3, receiving the high or logical 1 level from switch 103 by way of a terminal such as 111. This signal is then transferred to a region such as 113 of conductive material on one or more rotatable printed circuit discs. As the discs are rotated this signal is conveyed, by way of the conductive printed circuit portion to other stationary contacts, and ultimately to other terminals, such as 115, to be supplied as an output signal from the switch to the programmable counter divider 79. The switch may include a rotatable shaft 117 which passes through the stationary contact supports 119, 121 and 123, while being fixed to the two rotating printed circuit discs 125 and 127, whereby rotation of the shaft 117 to successive detented positions turns the two printed circuit boards 125 and 127 relative to the stationary sliding contacts, effecting the appropriate interconnections of the several terminals near the base of the switch. The particular interconnections of conductive portions of the printed circuit disc surfaces of course determine the particular digital code provided as an output for a particular switch position. The switch assembly may also include a printed circuit board 112, a transmit light emitting diode 114, volume control 116, and a squelch control 118.

Returning to the circuitry of FIGS. 1 and 4a through 4c, for simplex operation of the transceiver, it is intended that the receive and transmitted signals have the same carrier frequency. In the transmit mode, this carrier frequency is the frequency of the voltage controlled oscillator, and in the receive mode the frequency of the voltage controlled oscillator 55 is supplied, by way of buffer amplifier 57 and line 21 to the first mixer stage 33. Clearly, in the receive mode, the frequency on line 21 is not the frequency to be received but rather is a signal the frequency of which is off-set from the received carrier frequency by a specified intermediate frequency value. In the transceiver depicted for simplex operation, this intermediate frequency for off-set was selected as 10.7 megahertz. With this selected intermediate frequency, when the signal on line 21 varies in frequency from the transmitted signal by this intermediate frequency value, the transmitter is operating in a simplex mode and to achieve a duplex mode of operation, the signal on line 21 is simply made to vary from the transmitted carrier frequency by some other amounts. In an exemplary marine radio environment, the difference between the transmitted and received signal frequencies in a duplex mode of operation is 4.6 megahertz, and thus changing the frequency of the voltage controlled oscillator by 15.3 megahertz rather than 10.7 megahertz when changing from transmit to receive modes of operation provides for this duplex channel.

This additional intermediate frequency off-set or duplex operation is called for when the channel selector switch 71 provides a high or logical 1, 5 volt level on line 129. This signal passes through an inverting amplifier 131 so that a zero or low on line 133 designates the 15.3 megahertz off-set and the output of inverter 131 passes to the inputs of two further inverting amplifiers 135 and 137, so that a 1 on lines 139 and 141 similarly designates the 15.3 megahertz off-set. In the normal or simplex mode of operation, line 133 is high and lines 139 and 141 are low.

All of this channel or frequency selecting data is supplied to four integrated circuits 143, 145, 147 and 149. In the exemplary marine radio environment, all of the channels have transmit frequencies in the 156 or 157 megahertz range, and accordingly integrated circuit 143 receives a fixed binary coded decimal input corresponding to the two highest order digits 15. The next digit in the frequency is either a six or seven as determined by line 81. The particular number of hundreds of kilohertz is determined by the binary coded decimal indication on lines 83, 85, 87 and 89, while the 25 kilohertz increment (the channel spacing is 25 kilohertz) is determined by the bits on lines 91 and 93. The intermediate frequency off-set need only be applied to integrated circuits 145 and 147 to modify the channel identifying data during the receive mode of operation.

When the system is operating in the receive mode, a logical 1 (plus 5 volt) signal appears on line 151, whereas this line is at zero volts or low in the transmit mode. This voltage level in the receive mode causes integrated circuit 153 to supply a signal on line 155, allowing integrated circuits 145 and 147 to have the information supplied from switch 71 modified in accordance with the intermediate frequency off-set information on lines 133, 139 and 141, whereas in the transmit mode, this modification is not made. The fixed information which identifies the two high order digits in the actual frequency is also modified when a signal appears on line 155 due to the presence of a further high on line 157. Thus, in the transmit mode, integrated circuits 145 and 147 merely pass on the coded data from switch 71, whereas in the receive mode that data is modified by the data on lines 133, 139 and 141. The number of 25 kilohertz increments is invariant for transmit or receive and accordingly this coded data is supplied directly to integrated circuit 149 in either mode of operation.

A frequency reference, for example in the form of a crystal 159 resonating at 3.2 megahertz, has that reference frequency divided down in integrated circuit 161 to a 25 kilohertz reference frequency, which is supplied by way of line 163 as one input to a phase comparing integrated circuit 165. If the signal on line 163 is of the same frequency and phase as the signal incoming from the programmable counter divider 79 on line 167, no frequency corrective action is required, however, if these two signals are of a different frequency, they will also be out of phase and integrated circuit 165 will supply, by way of line 169, a corrective voltage to a voltage controlled oscillator 55. This voltage controlled oscillator also responds to incoming audio information on line 171 for modulation purposes. The voltage controlled oscillator output on line 173 passes through buffer amplifier 57 for use in the receive or transmit mode and is also supplied to a prescaling integrated circuit 175, which divides that oscillator frequency by 10 or 11 and passes this submultiple or aliquot frequency by way of line 177 to the low order counter 149. This submultiple frequency is also supplied by way of integrated circuit 179 to integrated circuit counters 181, 183 and 185. Integrated circuit 179 functions to increment the appropriate counter when another lower order counter reaches a prescribed value.

The counters 149 and 185 start counting down from the number programmed into them by the status of switch 71 until they reach a count of zero. During this counting process the prescaler 175 has been in its divide by eleven state. When the count in counters 149 and 185 reaches zero, the prescaler 175 is shifted into a divide by ten state, whereupon the counters 181 and 183 count down from the number programmed into them to zero, whereupon all counter stages are reset and the sequence starts over again, first dividing by eleven and then by ten.

Under frequency lock conditions, counter 79 is cycling or reaching its programmed maximum count N at a 25 kilocycle rate and the phase detector 165 need not correct the frequency of the voltage controlled oscillator 55. If this maximum count is changed by reprogramming, the counters either in changing from receive to transmit modes, or by varying the selector switch 71, a different maximum count will force the voltage controlled oscillator to a new frequency at which lock will again occur. The oscillator frequency programmed maximum count and the 25 kilocycle reference frequency are related by:

$$f_{osc} = f_{ref}[400N_2 + 40N_1 + 4A_1 + A_0]$$

For example, if it is desired to transmit on the marine emergency channel 16, switch 103 may be moved to the position providing a high signal on line 105, and therefore also on line 83. The reference frequency is fixed at 25 kilocycles, $N_2$ is the count in integrated circuit 181, $N_1$ is the count in integrated circuit 183, $A_1$ is the count in integrated circuit 185 and $A_0$ is the count in the low order integrated circuit 149. As noted earlier, the count for integrated circuit 181 is normally hard wired for 15, and the count in integrated circuit 183 will be 6, since the 6/7 line 181 is low. The line 183 corresponds to a binary coded decimal high order or 8 bit and accordingly $A_1$ will be 8. In this switch position, both lines 91 and 93 are low and the low order digit or $A_0$ will be 0, and the frequency of oscillation is given by:

$$f_{osc} = 25,000 [400 \times 15 + 40 \times 6 + 4 \times 8 + 0]$$

or $$f_{osc} = 156,800$$

which is the prescribed transmit frequency for channel 16. Changing $N_2$ and $N_1$, $A_1$ or $A_0$ by repositioning either switch 103 or switch 71, of course, defines a different frequency for the voltage controlled oscillator.

If the system fails to lock on frequency, phase detector 165 provides a signal on line 187 by way of the out of lock detector 189, and diode 190 to cause transistor 191 to conduct, and disable the transmitter. The decimal points in both LED displays (160 and 162) also light to let the operator know the synthesizer is out of lock and not usable.

The collector of transistor 191 is connected by way of coil 192 to the base of a transistor in the predriver or first amplifier 59 and when the transistor 191 conducts, this pulls the base of that transistor and bias network to ground, reducing the gain of the amplifier 59 essentially to zero, thereby eliminating the transmitter output.

Conduction by transistor 191 and its associated disabling of the transmitter may also occur with switch 101 in the position illustrated for operation on United States as opposed to international marine channels, when the transceiver is set to certain receive only channels. For example, if the dial selector switch 103 is set to select WX1, which is a weather channel, the 5 volt high signal is applied to line 107, which by way of diode 193 applies that high to the base of transistor 191. Whenever a high signal appears on line 195, a receive only light emitting diode 197 on the receiver front panel is also illuminated. A high also appears on line 195 whenever channel selector switch 71 is selecting a receive only channel and the switch contacts provide that high signal on line 99.

From the foregoing it is now apparent that a novel channel selecting arrangement meeting the objects and advantageous features set out hereinbefore, as well as others, has been disclosed. Modifications may be made by those having ordinary skill in the art without departing from the spirit of the invention or the scope thereof as illustrated by the claims which follow.

What is claimed is:

1. A channel switching system including a single rotary multiposition manually operable channel selector switch for a transceiver to select one of a plurality of possible carrier frequencies in the transceiver receive mode of operation and a corresponding one of a plurality of possible transmit carrier frequencies in the transceiver transmit mode of operation including means operable in certain channel selecting switch positions only or precluding transmitter operation without impeding the transceiver receive mode of operation, the means for precluding transmitter operation being inoperable in other than the certain channel selecting switch positions, whereby both receive and transmit modes of transceiver operation are possible.

2. A channel switching system including a multiposition manually operable channel selector switch for a transceiver to select a receive carrier frequency in the transceiver receive mode of operation and a transmit carrier frequency in the transceiver transmit mode of operation including means operable in each of several certain simplex channel selecting switch positions to select the same carrier frequency for transmission and reception and operable in each of several other duplex channel selecting switch positions to select a carrier frequency for transmission and a carrier frequency for reception with the selected carrier frequency for transmission being different from the selected carrier frequency for reception.

3. The channel switching system of claim 2 further including means operable in specified channel selecting switch positions for precluding transmitter operation on the carrier frequencies corresponding to those specified selected channels.

4. The channel switching system of claim 2 further including a two position switch operable independent of the channel selector switch to vary the specific channel selecting switch positions which correspond to duplex channels in which different frequencies are selected for transmission and reception.

5. The channel switching system of claim 2 further comprising an electrically illuminated channel indicating display directly enabled by the closing of contacts of the selector switch.

6. The channel switching system of claim 2 wherein the switch is movable between a plurality of rotary detent positions corresponding to different channels.

7. The channel switching system of claim 6 wherein the switch includes a plurality of stationary wiper contacts engaging a rotatable surface, the surface having conducting portions and insulating portions to interconnect certain contacts in some switch positions while electrically isolating those certain contacts in other switch positions.

8. The channel switching system of claim 1 further including means operable in each of several certain simplex channel selecting switch positions to select the same carrier frequency for transmission and reception and operable in each of several other duplex channel selecting switch positions to select a carrier frequency for transmission and a carrier frequency for reception with the selected carrier frequency for transmission being different from the selected carrier frequency for reception, and a two position switch operable independent of the channel selector switch to vary the specific channel selecting switch positions which correspond to duplex channels in which different carrier frequencies are selected for transmission and reception.

9. The channel switching system of claim 1 further comprising an electrically illuminated channel indicating display directly enabled by the closing of contacts of the selector switch.

10. The channel switching system of claim 1 wherein the switch is movable between a plurality of rotating detent positions corresponding to different channels.

11. The channel switching system of claim 10 wherein the switch includes a plurality of stationary wiper contacts engaging a rotatable surface, the surface having conducting portions and insulating portions to interconnect certain contacts in some switch positions while electrically isolating those certain contacts in other switch positions.

12. A transceiver channel selection circuit operable in both the transmit and receive modes of operation with some channels being simplex channels, others duplex channels and still others being receive-only channels and comprising a digital phase lock circuit including a controllable oscillator, a reference frequency source, means for obtaining a signal the frequency of which is a submultiple of the frequency of the controllable oscillator, and means for comparing the reference frequency and the submultiple frequency and for varying the oscillator frequency when the two compared frequencies differ, the means for obtaining including a manually operable selector switch for determining specific submultiples which submultiples differ between receive and transmit modes by a fixed amount for a simplex channel and by a different fixed amount for a duplex channel.

13. The circuit of claim 12 wherein the selector switch includes means operable in receive-only channel selecting positions for precluding transmitter operation.

14. The circuit of claim 12 further comprising a second manually operable switch for selectively changing certain channels between simplex and duplex operation.

15. The circuit of claim 14 further comprising an electrically illuminated channel indicating display directly enabled by the closing of contacts of the selector switch and independent of the second switch.

* * * * *